United States Patent [19]

Haddon et al.

[11] Patent Number: 4,835,478

[45] Date of Patent: May 30, 1989

[54] METHOD AND APPARATUS FOR ACOUSTIC DETECTION OF FAULTS IN UNDERGROUND CABLES

[76] Inventors: Merrill K. Haddon, 13545 SW. Village Glenn, Tigard, Oreg. 97223; Clifford H. Moulton, 4175 SW. Dogwood Ln., Portland, Oreg. 97225

[21] Appl. No.: 235,741

[22] Filed: Aug. 22, 1988

Related U.S. Application Data

[63] Continuation of Ser. No. 15,365, Feb. 17, 1987, abandoned.

[51] Int. Cl.$^4$ .................. G01R 31/08; G01R 31/10
[52] U.S. Cl. .................................. 324/536; 324/509; 324/528; 324/543; 340/650
[58] Field of Search ............... 324/509, 512, 527, 528, 324/536, 539, 67, 541, 543, 544; 73/40.5 A, 587; 340/683, 650

[56] References Cited

U.S. PATENT DOCUMENTS 3,264,864  8/1966  Reid et al. .................. 73/40.5 A
3,838,593  10/1974  Thompson .................. 73/40.5 A
4,459,851  7/1984  Crostack .................. 73/587

Primary Examiner—Reinhard J. Eisenzopf
Assistant Examiner—Jack B. Harvey
Attorney, Agent, or Firm—Chernoff, Vilhauer, McClung & Stenzel

[57] ABSTRACT

An acoustic detection method and apparatus includes a source of high voltage pulses to be applied to an underground cable suspected of having a ground fault. As the pulses encounter the fault, acoustic energy is generated which may be sensed by a pair of transducers located along the path of the cable. The transducers are connected to signal processing circuitry which provides a display signal indicating which of the two transducers lies closer to the fault. The transducers are moved along the path of the cable in the direction indicated and the test is repeated until the fault is indicated as lying in the opposite direction. Thereafter the transducer are moved in the opposite direction in a shorter increment. This procedure is repeated until the direction to the fault changes each time the transducers are moved. The fault then lies midway between the midpoints of each of the two final transducer positions.

11 Claims, 2 Drawing Sheets

METHOD AND APPARATUS FOR ACOUSTIC DETECTION OF FAULTS IN UNDERGROUND CABLES

This application is a continuation of application Ser. No. 15,365, filed 2/17/87, now abandoned.

BACKGROUND OF THE INVENTION

The following invention relates to a fault detector for electrical transmission lines such as buried cables and the like, which detects acoustic energy resulting from a high voltage test pulse arcing to ground at a fault location. Many electrical cables and transmission lines which are buried under the ground develop cracks or faults as a result of rotting or moisture. These faults lead to a short circuit to ground, the location of which is often difficult to detect. In the past, devices have been proposed for the detection of the location of such underground faults using a variety of methods. For example, Williams, U.S. Pat. No. 3,299,351, discloses an electromagnetic field sensing arrangement which compares the phase relationship between the two frequency components of a composite test signal to determine the location of the fault relative to a pair of tuned circuit detectors. A similar device is shown in Link, U.S. Pat. No. 4,039,938. Another device, Pardis, U.S. Pat. No. 4,063,161, locates faults by determining the differences in electrical potential sensed at two locations relative to the fault. A transient surge detector which utilizes a pair of detection units coupled by a radio link is shown in Weintraub, U.S. Pat. No. 2,717,992. All of the aforementioned devices rely upon some type of electromagnetic field detection for determining the location of the fault. Such circuits are either inaccurate due to the difficulty of accurately processing the information at the detection points, or are overly complex if accurate signal processing is to be used.

Another method used in the past to locate faults in buried electrical cable relied upon the fact that when a high voltage pulse reaches a fault location, it arcs to ground, and a noise is sometimes audible, either to the unaided ear or to electronic listening devices. Thus, an electrical pulse generator known as a 'thumper' has been used to generate electrical test signals along a cable. The general area of the fault could then be located by listening for the characteristic sound produced by the arcing of the high voltage pulse. This method, however, is useful only for locating the general vicinity of the fault. This is due to the fact that the sound is omnidirectional and diffuses through the earth so that determining the source of the sound is extremely difficult.

SUMMARY OF THE INVENTIION

The present invention provides a method and apparatus for determining the location of a fault in a buried cable by generating an electrical signal on the cable and placing two acoustic transducers generally along the path of the cable a predetermined distance apart. The direction of the fault is determined relative to the location of the two acoustic transducers by identifying the transducer that first detects the characteristic sound created by the arcing of the electrical test signal. Once the transducer is identified which first detects the sound, both transducers are moved in the direction of the first detecting transducer and the test is repeated. When the direction of the fault location changes, the detectors are moved in the opposite direction a shorter distance along the cable path. When the direction to the fault changes each time the detectors are moved, the fault may be located by drawing lines bisecting the distance between both detectors at each location and by determining a midpoint between the two bisecting lines.

Both transducers are connected to electrical signal processing circuitry which determines, by comparing the outputs of each transducer, which one first detects the acoustic energy created at the fault. This may be accomplished by setting an amplitude threshold and determining which detector output signal first reaches that threshold. In order to correlate the detection of the acoustic energy with the generation of the test impulse, an electromagnetic field detection circuit may be employed.

It is a principal object of this invention to provide a method and apparatus for locating a fault in an underground cable by detecting the acoustic energy generated by the arcing to ground of a high voltage pulse.

A further object of this invention is the detection of acoustic energy generated at the fault by a high voltage test pulse by converting the acoustic energy into electrical signals and comparing the electrical signals to determine which of two transducers first senses the acoustic signal.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
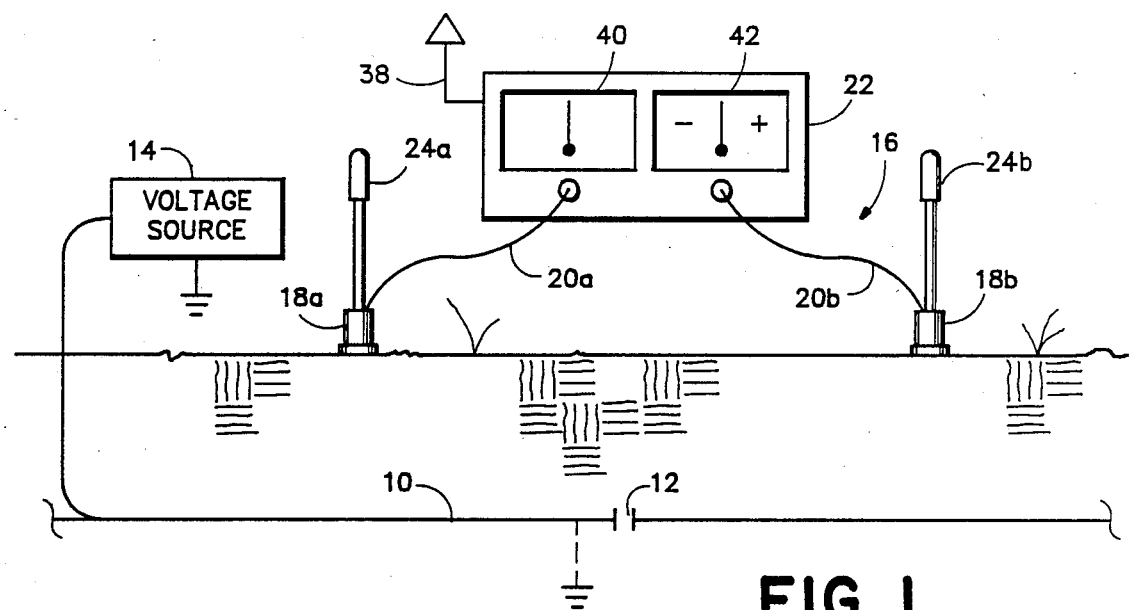
FIG. 1 is a schematic drawing of the apparatus of the present invention utilizing a pair of surface contact transducers.

An underground cable 10 may develop a fault 12 which takes the form of a break in the cable, and a resulting short circuit to ground is shown by the dashed line of FIG. 1. In order to detect the fault, a device known as a "thumper," represented by voltage source 14, may be connected to the cable 10 and may insert a series of high voltage test pulses onto the cable 10. The acoustic detection system 16 of the present invention comprises a pair of acoustic transducers 18a and 18b connected by cables 20a and 20b to a signal processing unit 22.

Figure 3:
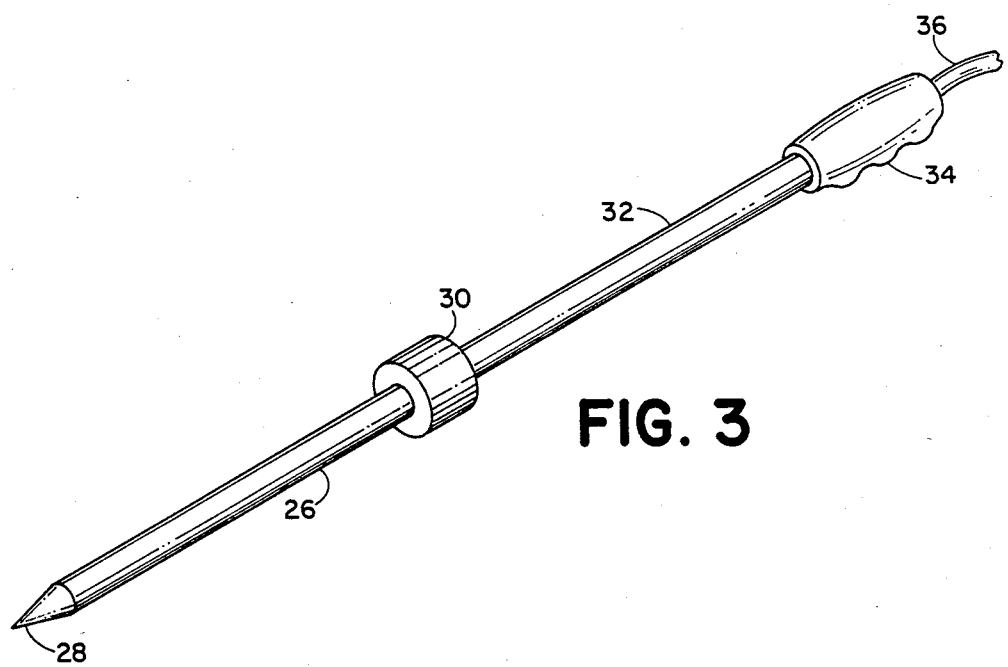
FIG. 3 is a perspective view of an earth implantable transducer which may be used as a substitute for the earth contacting transducers of FIG. 1.

The acoustic transducers 18a and 18b are of the earth contacting variety and may be moved from place to place on the surface of the ground by handles 24a and 24b. A different type of transducer is shown in FIG. 3. An implantable transducer 26 includes a sharpened point 28 for penetrating the earth, and a stop 30 for preventing the transducer from being pushed too deep. The transducer itself together with associated circuitry (not shown) is housed inside a cylindrical rod 32. The implantable transducer 26 includes a handle 34 and an output cable 36 for connection to signal processing unit 22. This transducer is more useful in soft or marshy ground where sound waves tend to be absorbed and better ground contact is needed.

Referring once again to FIG. 1, the signal processing unit 22 may include an antenna 38. The antenna is connected to conventional circuitry (not shown) within signal processing unit 22, which detects the presence of a strong electromagnetic field such as that which would result from the presence of a voltage pulse on cable 10 from voltage source 14. A meter 40 on the front panel of the signal processing unit 22 provides an indication of the relative field strength of any electromagnetic pulse sensed, and is used to correlate the generation of test impulses from voltage source 14 with readings observed as the result of acoustic detection of a characteristic sound made by the high voltage pulses arcing to ground at the fault location 12. A second meter 42 on the front panel of signal processing unit 22 provides an indication, either plus or minus, to indicate which of the two transducers 18a or 8b lies closest to the fault. Since sound is omnidirectional, any noise made by a high voltage pulse arcing to ground will arrive either at transducer 18a or at transducer 18b first unless both transducers are equidistant from the fault. The meter 42 indicates which of the transducers 18a or 18b first detects the accoustic signal.

Figure 2:
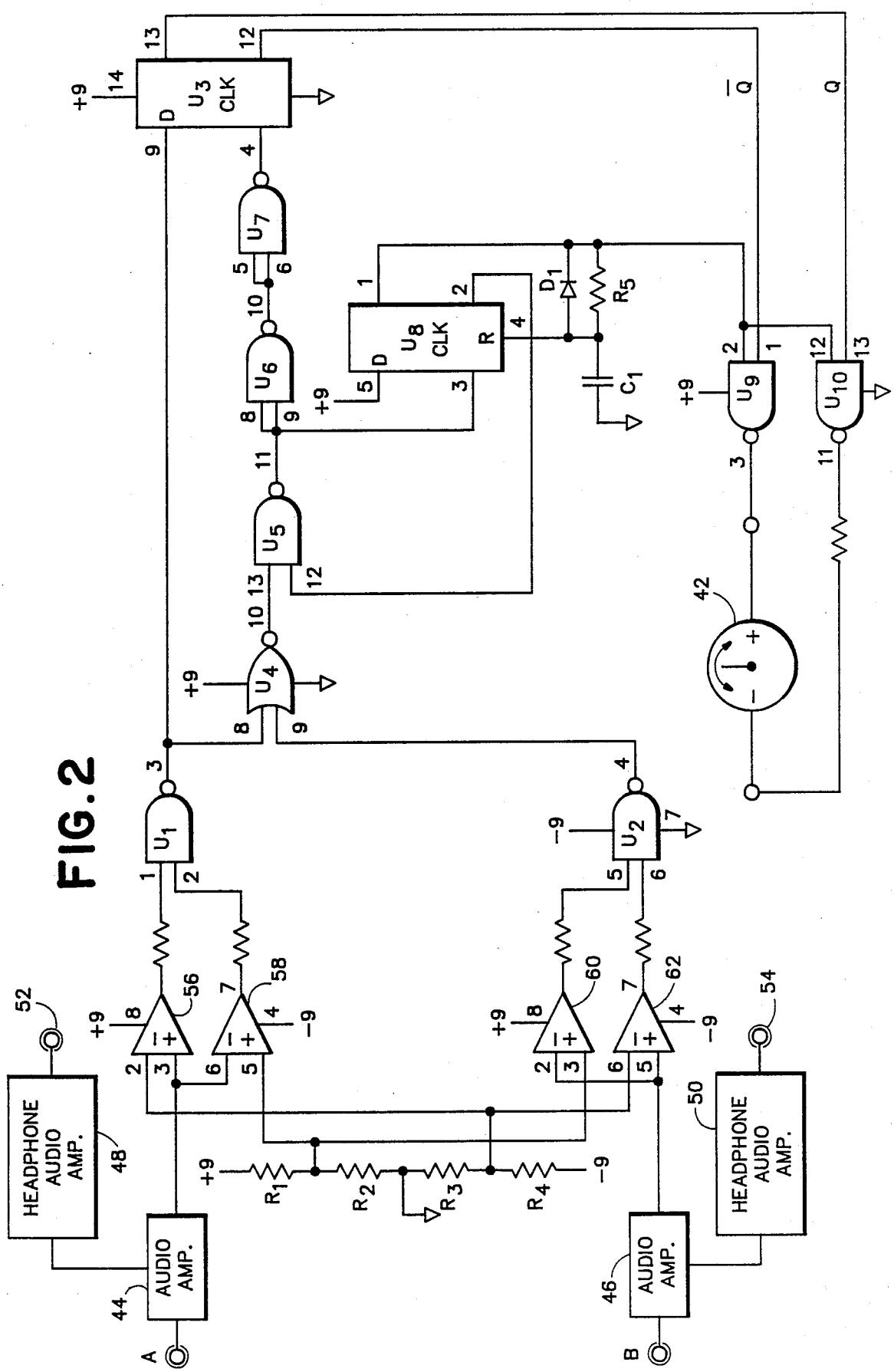
FIG. 2 is a block schematic diagram of the circuit utilized in the apparatus of FIG. 1 for determining the direction of a fault relative to the placement of the two transducers.

Referring now to FIG. 2, inputs from transducers 18a and 18b are received at inputs A and B, respectively. Audio amplifiers 44 and 46 raise the gain of the electrical output from the transducers 18a and 18b, respectively, to a convenient voltage level for signal processing. Headphone audio amplifiers 48 and 50 are connected to each respective channel (A and B) and include respective output jacks 52 and 54 so that a pair of headphones (not shown) may be connected. The outputs of audio amplifiers 44 and 46 are provided to respective pairs of threshold comparator amplifiers (amplifiers 56 and 58 for the output of audio amp 44, and amplifiers 60 and 62 for the output of audio amp 46). The other inputs to amplifiers 56, 58, 60 and 62 are provided by a voltage divider network consisting of R1, R2, R3 and R4. This voltage divider network provides output threshold voltages of plus or minus one volt to respective inputs of amplifiers 56, 58, 60 and 62. Thus, if the output of either audio amplifier 44 or audio amplifier 46 exceeds plus or minus one volt, an output signal from the appropriate amplifier will appear as an input on either pin 1 or pin 2 of NAND gate U1 or pin 5 or pin 6 of NAND gate U2. The outputs of U1 and U2 are normally low because both of their respective inputs are normally high. If the A or B input encounters a signal that rises past one volt, either plus or minus, then either NAND gate U1 or U2 will be triggered, producing a high output.

The trigger will thus be caused by the electrical output of the transducer, either 18a or 18b, which first senses a sound emanating from fault 12. The first transducer to sense the sound will also provide the strongest electrical output since the electrical output of a transducer is directly proportional to the strength of the acoustic energy sensed. Since sound energy is attenuated in its medium as a function of distance, the transducer that is farther away from the sound will produce an output signal of a lower amplitude. The signal having the lower amplitude also has a more gentle slope with respect to time. Thus the higher amplitude signal has a faster rise time and reaches the threshold of one volt before the more gently sloped lower amplitude signal. Thus the comparator formed by amplifiers 56, 58, 60 and 62 and voltage divider R1, R2, R3 and R4 also acts as an amplitude comparator sensitive to the relative signal strength of the two incoming signals.

The identity of the NAND gate, either U1 or U2, that first goes high determines the logical input to data input pin 9 of flip-flop U3. If NAND gate U1 first senses an output from either amplifier 56 or 58, then pin 3 of NAND gate U1 goes high and the data input of flip-flop U3 is high. On the other hand, if U2 first senses an output from either amplifier 60 or 62, the data input to U3 remains low. This input determines the output state of pins 12 and 13 of U3 which, in turn, determine which way the needle of meter 42 will deflect.

When either U1 or U2 goes high, the output of NOR gate U4, which is normally high, goes low. This drives the output of NAND gate U5 high which, in turn, drives the output of NAND gate U6 low. This, in turn, drives the output of NAND gate U7 high, thus providing a positive-edge clock input to pin 4 to U3. When U5 goes high it also triggers flip-flop U8 which, in turn, provides a feedback pulse on pin 12 of U5 to keep U5 high for a predetermined period of time. This maintains the latched state of the outputs of U3 because it maintains the clock input on pin 4 of U3 in a high logic state. The other output, on pin 1 of flip-flop U8, is the high output and begins to charge C1 through resistor R5. C1 will continue to charge until it reaches a voltage level sufficient to trigger the reset of U8 (pin 4). The high output at pin 1 of U8 is provided to an input of NAND gates U9 and U10. This turns on both gates, and, depending upon the outputs at pins 13 and 12 of U3, U9 and U10 will assume logic states which cause meter 42 to deflect in either the positive or negative direction. Through the clocking action of U8 through U9 and U10, the meter will deflect in one direction or the other for the same amount of time that is required for C1 to charge to the reset voltage level of U8. U8 is then turned off and the outputs of U9 and U10 become the same. Thereafter, pin 12 of U5 goes high which causes U6 and U7 to release again the clock input to U3.

Thus, the circuit shown in FIG. 2 provides an indication of the identity of the transducer that first detects an acoustic signal. Latching circuitry associated with U8 prevents secondary sound reflections or a subsequent sonic emission from the fault 12 from interfering with the first reading taken.

In order to correlate the sound received by acoustic transducers 18a and 18b with the voltage pulse generated by voltage source 14, the user may observe the field meter 40 for the presence of an electromagnetic pulse sensed by antenna 38 at the same time that the meter 42 deflects in one direction or the other. An alternative method would be to provide an output from the electomagnetic field detection circuitry (not shown) as an additional enable signal at U5 to allow clocking only when an electromagnetic field of sufficient intensity had been sensed.

Usually the general location of the underground cable is known. It is possible to find the approximate vicinity of the fault 12 by using the electromagnetic field sensing feature of the system. This is accomplished by travelling directly over the cable route while the line 10 is being pulsed by voltage source 14. The meter 40 will show a deflection each time a voltage pulse travels down the length of the cable 10. However, past the point at which the fault is located, the pulse will be much weaker because most of the voltage from voltage source 14 arcs to ground at the fault location 12. Thus, the location above the cable path where there is a noticeable change in the electromagnetic field intensity resulting from each voltage pulse is the general area where the fault 12 is located. In utilizing the above procedure, it is best to adjust the sensitivity of the electromagnetic field monitoring circuit (not shown) to the lowest possible value at which a reading may still be obtained from meter 40. In this way it will be easier to locate the path of the cable 10 and once the fault is passed, the absence of any meter reading at all will indicate that the fault is nearby, if previous meter readings had been observed while travelling the cable route.

In order to utilize the acoustic detector system, the transducers 18a and 18b are placed over the path of the cable a predetermined distance apart, for example 30 inches. With the transducers 18a and 18b set this far apart, the sound from the fault 12 being pulsed by voltage source 14, will reach one of the transducers (in FIG. 1, transducer 18a) before it reaches the other. The processing circuitry of FIG. 2 as described above will cause the meter 42 to indicate which transducer is closest to the fault 12. Next, both transducers 18a and 18b are moved a predetermined distance (for example, 3 feet) along the length of the cable in the direction indicated by meter 42. Once again the meter 42 is checked. If the meter 42 still indicates the same direction, the same transducer is closer to the location of the fault 12, and the previous step is repeated. This step is repeated until the meter 42 indicates the opposite direction, indicating that the other transducer is now closer to the fault. When this occurs, both transducers 18a and 18b are moved in the opposite direction toward the fault, but this time they are moved a shorter distance (for example, 1 foot) along the cable path. Meter readings are taken to determine the direction of the fault at each position. This procedure is repeated until the direction to the fault indicated by the meter 42 reverses each time the transducers 18a and 18b are moved in the reverse direction along the path of the cable. When this occurs, a mark is made on the ground halfway between the transducers 18a and 18b at one location, and halfway between the transducers at the opposite location. The actual fault location should be halfway between these two marks.

The fault location may be checked by placing one transducer directly over the expected location of the fault, and taking readings with the other transducer located at four locations spaced 90° apart and approximately 30 inches away. Each reading should indicate that the direction to the fault is toward the transducer located directly over the expected fault location.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of determining the locations of a fault in an electrical cable, comprising the steps of:
    (a) generating an electrical signal pulse on said cable to create an acoustic impulse at the location of said fault;
    (b) placing two acoustic transducers along the path of said cable a predetermined distance apart;
    (c) electronically sensing the first receipt in time of a signal representative of said acoustic impulse above a predetermined threshold generated by the one of the transducers closest to the fault, and inhibiting the receipt of subsequent signals from the other of said acoustic transducers;
    (d) providing a visual indication of the identity of the transducer that is closest to the fault while simultaneously inhibiting subsequent signals from both transducers for a predetermined time thereafter; and
    (e) moving both transducers a predetermined distance toward the fault, generating a second electrical pulse signal on the cable, and repeating steps (c) and (d).

2. The method of claim 1, further including as set (f) moving both transducers a predetermined distance, said distance being shorter than the predetermined distance of step (e), and in the opposite direction from the distance moved in step (e), when the direction of the fault is indicated as being in an opposite direction to the direction moved in step (e) as a result of the execution of steps (c) and (d).

3. The method of claim 2 further including as step (g) repeating steps (c), (d), (e) and (f) until the direction of the fault changes each time step (c) is executed.

4. The method of claim 3, further including as step (h) drawing a first line bisecting the distance between the transducers in a first location determined by step (g), drawing a second line bisecting the distance between the transducers in a second location determined by step (g), and determining the midpoint between said first and second lines to locate the position of the fault.

5. The method of claim 4, further including as step (i) placing a first transducer directly over the position of the fault located in step (h), placing a second transducer at a plurality of points equidistant from said first transducer, and repeating step (c) for each of said points.

6. The method of claim 5 further including as step (j) determining an approximate location of said fault by taking electromagnetic field measurements sat sequential points along the path of said cable and marking the location at which there is an abrupt charge in the electromagnetic field intensity, said location being indicative of the approximate location of said fault.

7. The method of claim 1 further including the step of electrically detecting the arrival of the electrical pulse signal along the cable so as to correlate the generation of said electrical pulse signal with the performance of step (c).

8. A directonal acoustic detector for determining the location of a fault in an electrical cable comprising:
    (a) means connected to said electrical cable for producing an electrical test pulse;
    (b) a pair of acoustic transducer means for detecting the occurrence of an acoustic signal generated when said electrical test pulse arrives at said fault;
    (c) signal processing means including threshold detection means responsive to electrical outputs from each of said transducer means for determining which one of said pair of acoustic transducer means first detects said acoustic signal by sensing the first receipt in time of one of said electrical outputs, which is above a preset threshold level, produced by one of said transducer means and (d) latching circuit means including inhibit means for locking out subsequent signals from the other one of said acoustic transducer means which is not the first to detect said acoustic signal.

9. The directional acoustic detector of claim 8, further including electromagnetic field detection means for correlating the detection of said acoustic signal with the generation of said electrical test pulse.

10. The directional acoustic detector of claim 8, further including display means responsive to said signal processing means for indicating which one of said pair of acoustic transducer means first detects the occurrence of said acoustic signal.

11. The directional acoustic detector of claim 10 wherein said signal processing means further includes inhibit means for locking said signal processing means in a first detection state for a predetermined period of time when one of said pair of acoustic transducer means detects the occurrence of an acoustic signal.

* * * * *

UNITED STATES PATENT AND TRADEMARK OFFICE
CERTIFICATE OF CORRECTION

PATENT NO. : 4,835,478

DATED : May 30, 1989

INVENTOR(S) : MERRILL K. HADDON and CLIFFORD H. MOULTON

It is certified that error appears in the above-identified patent and that said Letters Patent is hereby corrected as shown below:

In the Abstract:

Line 12, change "transducer" to --transducers--.

Column 1, line 44 change "'thumper'" to --"thumper"--.

Column 5, line 64 change "locations" to --location--.

Column 6, line 18 change "set" to --step--; and

Column 6, line 43 change "sat" to --at--.

Signed and Sealed this

Twenty-ninth Day of September, 1992

Attest:

DOUGLAS B. COMER

*Attesting Officer*        *Acting Commissioner of Patents and Trademarks*